United States Patent [19]

Chin et al.

[11] 4,447,822

[45] May 8, 1984

[54] LIGHT EMITTING DIODE

[75] Inventors: Aland K. Chin, Berkeley Heights; Michael A. DiGiuseppe, Succasunna; Henryk Temkin, New Providence, all of N.J.

[73] Assignee: Bell Telephone Laboratories, Incorporated, Murray Hill, N.J.

[21] Appl. No.: 304,175

[22] Filed: Sep. 21, 1981

[51] Int. Cl.³ .......................................... H01L 33/00
[52] U.S. Cl. ......................................... 357/17; 357/16
[58] Field of Search .................................... 357/17, 16

[56] References Cited

U.S. PATENT DOCUMENTS

| | | | |
|---|---|---|---|
| 4,233,090 | 11/1980 | Hawrylo | 357/16 |
| 4,355,396 | 10/1982 | Hawrylo | 357/17 X |
| 4,359,774 | 8/1983 | Olsen | 357/17 X |
| 4,374,390 | 2/1983 | Lee | 357/17 |

OTHER PUBLICATIONS

Appl. Phys. Lett., vol. 33, No. 4, Aug. 15, 1978, pp. 314–316.
Appl. Phys. Lett., vol. 36, No. 6, Mar. 15, 1980, pp. 444–446.
Japanese Journal of Applied Physics, vol. 19, No. 8, Aug. 1980, pp. L495–L497.

*Primary Examiner*—Martin H. Edlow
*Attorney, Agent, or Firm*—Arthur J. Torsiglieri

[57] ABSTRACT

A light emitting diode designed to emit primarily at 1.3 microns comprises a crystal having a plurality of lattice matched layers including an n-type indium phosphide front surface layer, an n-type indium phosphide buffer layer, a p-type indium gallium arsenide phosphide active layer, a p-type indium phosphide confining layer and an indium gallium arsenide back surface layer, and an annular front contact and a limited area back contact to the crystal.

7 Claims, 1 Drawing Figure

U.S. Patent      May 8, 1984      4,447,822
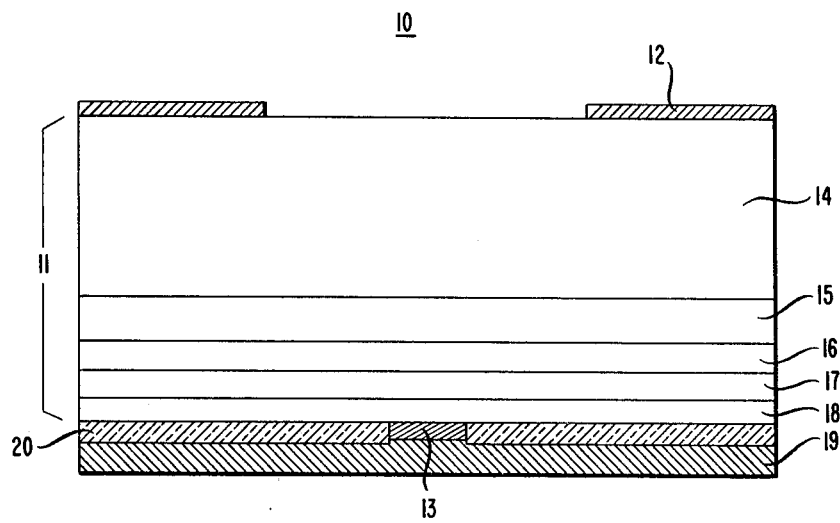

LIGHT EMITTING DIODE

TECHNICAL FIELD

This invention relates to light-emitting diodes useful at about 1.3 microns.

BACKGROUND OF THE INVENTION

There presently exists considerable interest in LEDs useful at about 1.3 microns because this spectral region corresponds to the dispersion minimum of the low loss silica based optical fibers which are becoming of increasing importance in optical transmission systems.

LEDs normally are preferred over lasers for use in many systems of this kind because of their lower cost, greater ruggedness and generally longer life.

Presently, for operation at 1.3 microns, a typical LED comprises a crystal comprising, in turn, a relatively thick, relatively highly doped n-type indium phosphide layer, a relatively thin relatively lightly doped n-type indium phosphide buffer layer, a still thinner lightly doped p-type indium gallium arsenide phosphide active layer and a thicker more heavily doped p-type indium phosphide confining layer. Additionally, a small dot metallic electrode makes a low resistance connection to the p-type indium phosphide back layer, and an annular metallic electrode makes low resistance connection to the n-type indium phosphide front layer. The limited area dot electrode serves to confine the current flow through the crystal and the consequent region of light emission.

Unlike a laser where the stimulated emission is highly directional parallel to the layers, in an LED the spontaneous emission is omnidirectional. It has generally been believed important for high efficiency to provide for the reflection of light emitted initially in the direction of the dot-contact surface back towards the annular-contact front surface for capture there by an optical fiber whose input end is butted to the central portion of this front surface. Typically, the diameter of the dot is made slightly smaller than the core diameter of the fiber so that as much as possible of the light generated is captured by the input end of the fiber.

Similarly, to maximize the capture of generated light, it has been the practice to avoid light absorptive material in the crystal in the path of useful light, including light back-scattered from the back surface.

In LEDs, especially of the quaternary type, it is desirable to minimize series resistance to minimize heating effects which are deleterious to long useful operation. In particular, it is important to keep low the contact resistance at the electrode connections, particularly at the dot contact which has a smaller area and so tends to be the main source of the contact resistance.

SUMMARY OF THE INVENTION

The contact resistance to p-type InGaAsP compositions, lattice matched to InP, decreases with decreasing amounts of phosphorus and is a minimum at the endpoint, corresponding to the ternary mixture InGaAs. However, compositions with decreasing amounts of phosphorus tend to have bandgaps corresponding to longer and longer wavelengths, and the endpoint ternary composition has a bandgap corresponding to about 1.6 microns. Such material is highly absorptive of 1.3 microns radiation; and accordingly, is generally believed to be unsuitable for use in the light path in an LED designed to generate light largely of 1.3 microns wavelength. In particular, it would appear unsuitable for use as the back contact layer in a high power LED of such wavelength because it would intercept any light that might have otherwise been reflected back towards the front surface for utilization.

However, we have discovered that the loss of this back-scattered light is tolerable both because the amount of the back-scattered light actually captured in a useful fashion by the input end of the fiber is normally only a small fraction of the light generated and more importantly this loss can be readily overcome by the larger amount of light generated by the larger drive current now practical to use because of the reduced contact resistance, resulting from use of the InGaAs contact layer.

Accordingly, an LED in accordance with a preferred embodiment of our invention includes a crystal which comprises, in turn, an n-type InP front surface layer, an n-type indium phosphide layer, a p-type indium gallium arsenide phosphide layer, a p-type indium phosphide layer, and an indium gallium arsenide back surface layer with a dot contact to the back layer and an annular larger contact to the front layer.

BRIEF DESCRIPTION OF THE DRAWING

The FIGURE is a cross section of an LED in accordance with one embodiment of the invention. Because of the much smaller dimensions in the vertical direction than the horizontal, the Figure is not to scale.

DETAILED DESCRIPTION

With referene now to the drawing, it shows in cross section an LED 10 comprising a semiconductive single crystal 11 provided with an annular circular electrode 12 at its front surface, and a circular dot electrode 13 on its back surface. In operation a suitable voltage source (not shown) is connected to establish a voltage difference between the two electrodes to provide a forward bias to the PN junction included within the crystal in the manner usual with LEDs.

In one embodiment tested, the crystal 11 had a 20 mils square cross section and a thickness of about 100 microns. Additionally, the crystal 11 had a plurality of parallel planar layers. The front surface layer 14 provided most of the bulk of the crystal necessary to facilitate manufacture and handling. It was n-type indium phosphide doped with sulphur to a concentration of at least $5 \times 10^{18}$ atoms per cubic centimeter. This layer was about 90 microns thick.

Layer 15 was a more lightly doped n-type indium phosphide layer about 4 microns thick. It was tin doped to a concentration of about $1 \times 10^{18}$ per cubic centimeter. It serves primarily as a buffer layer to provide a more carefully grown and so more uniformly doped region between the relatively gross layer 14 and the active layer 16. Its thickness was about 4 microns.

The active layer 16 which was lattice matched to the indium phosphide was the quaternary indium gallium arsenide phosphide of a composition to emit radiation primarily at about 1.3 microns wavelength. As is known, this consideration is met by a mixture of about $In_{0.73}Ga_{0.27}As_{0.63}P_{0.37}$. This layer was p-type largely as a result of zinc doping to a concentration of about $5 \times 10^{17}$ per cubic centimeter, and had a thickness of about 0.7 micron.

Layer 17 was a p-type indium phosphide layer of about 3 microns thickness doped with zinc to a concentration of about $3\times 10^{18}$ per cubic centimeter. It serves primarily as a high bandgap region to confine electrons injected into the active layer to such layer until they recombine with holes for the emission of light. Finally, back surface layer 18 was a heavily doped p-type indium gallium arsenide layer. For lattice matching, its composition was $In_{0.53}Ga_{0.47}As$. Its thickness was about 1 micron thick and is doped with zinc to a concentration of about $2\times 10^{19}$ atoms per cubic centimeter. It serves primarily to permit a low resistance connection to be made to the crystal by the small area dot electrode 13, as was discussed previously.

The dot electrode 13 was a circle of about 25 microns diameter. It comprised an initial layer about 800 Angstroms thick of a one percent beryllium gold alloy covered with a layer of about 2100 Angstroms of gold. To provide a low thermal impedance for the finished device, a heat sink was provided.

The heat sink was a layer 19 about 15 microns thick of plated gold. To limit the direct electrical connection of the heat sink to the dot electrode, the intermediate dielectric layer 20 was included. This is a layer of silicon dioxide about 1000 Angstroms thick over the back surface except over the dot electrode. To promote adherence between the gold sink 19 and the layer 20, there was provided an intermediate composite layer (not shown) comprising a layer 1000 Angstroms thick of evaporated titanium and a layer of about 3000 Angstroms thick of evaporated gold.

The annular electrode 12 on the front surface had an outer perimeter which was a square twenty mils on a side and an inner perimeter which was a circle 10 mils in diameter. It comprised a multilayer consisting of 2000 Angstroms thick gold, 500 Angstroms tin and 30,000 Angstroms gold, evaporated in turn.

A crystal of the kind described was made using a liquid phase epitaxial growth process known to workers in the art. The growth was on a {100} sulphur doped indium phosphide crystal that provided the bulk portion 14. The epitaxial layers 15, 16 and 17 were grown in conventional fashion. To minimize lattice mismatch of layer 18, it was found advantageous to employ a two-step growth process. This layer was grown in a separate run at 635 degrees Celsius, but a shallow meltback of layer 17 was done before contact was made to the InGaAs melt for growing the ternary layer. This two-step procedure was believed an improvement because it avoided contamination of the ternary melt with phosphorus.

It should be appreciated that the specific design parameters mentioned are merely illustrative of one design and other parameters are possible consistent with the spirit and scope of the invention. In particular, doping concentrations and layer thicknesses can vary over fairly wide ranges, as is known to workers in the art. Additonally, it should be evident that the resistivity types of the various layers may be reversed, although with some possible loss in ease of fabrication. This should be accompanied by an appropriate change in composition of the contacts to minimize the contact resistances. However, the specific embodiment described is preferred because of the more effective current confinement possible in a p-type contact layer. In addition, other metal systems are feasible for the contacts.

It should also be evident that a variety of processes may be employed for fabrication. For example, it should be feasible to employ either vapor phase epitaxy or molecular beam epitaxy to fabricate one or more of the layers. Similarly it may be feasible if the starting crystal is of high enough quality to avoid need of a separate buffer layer so that layers 14 and 15 in the embodiment described can be replaced by a single layer.

What is claimed is:

1. A light emitting diode designed for incoherent emission at about 1.3 microns in a direction essentially normal to the front face of the diode comprising a semiconductive crystal having successive contiguous layers, including a front layer of indium phosphide, a first intermediate active layer of indium gallium arsenide phosphide, a second intermediate layer of indium phosphide, and a back layer of indium gallium arsenide, a first electrode making low resistance electrical connection to the front layer, and a second electrode making low resistance electrical connection to the back layer, the crystal being free of any layer substantially absorptive of the emission at about 1.3 microns between the active layer and the front layer where the emission exits.

2. A light emitting diode in accordance with claim 1 in which the first electrode makes a low resistance electrical connection to the exposed face of the front layer and the second electrode makes a low resistance electrical connection to the exposed face of the back layer.

3. A light emitting diode in accordance with claim 2 in which the front layer comprises a first connection layer portion which is heavily doped and a second buffer layer portion which is less heavily doped.

4. A light emitting diode in accordance with claim 3 in which the front layer is n-type, the first and second intermediate layers are p-type, and the back layer is p-type.

5. A light emitting diode in accordance with claim 1 in which the first electrode is annular and the second electrode is circular and coaxial with the first electrode whereby the emission exits through the circular region enclosed within the annulus of the first electrode.

6. A light emitting device in accordance with claim 4 in which the first electrode is annular and the second electrode is circular and coaxial with the first electrode, whereby the emission exits through the circular region enclosed within the annulus of the first electrode.

7. A light emitting diode in accordance with claim 4 in which the active layer is $In_{0.73}Ga_{0.27}As_{0.63}P_{0.37}$ and the back layer is $In_{0.53}Ga_{0.47}As$.

* * * * *